(12) United States Patent
Inoue et al.

(10) Patent No.: US 6,623,801 B2
(45) Date of Patent: Sep. 23, 2003

(54) METHOD OF PRODUCING HIGH-PURITY POLYCRYSTALLINE SILICON

(75) Inventors: Shinichiro Inoue, Hiratsuka (JP); Yoshifumi Yatsurugi, Fujisawa (JP)

(73) Assignee: Komatsu Ltd., Tokyo (JP)

( * ) Notice: Subject to any disclaimer, the term of this patent is extended or adjusted under 35 U.S.C. 154(b) by 186 days.

(21) Appl. No.: 09/916,313

(22) Filed: Jul. 30, 2001

(65) Prior Publication Data

US 2003/0021894 A1 Jan. 30, 2003

(51) Int. Cl.[7] .............................................. C23C 16/24
(52) U.S. Cl. ........................ 427/255.18; 427/255.24; 427/314; 423/348; 423/349; 423/350
(58) Field of Search ................ 427/255.18, 255.24, 427/314; 423/348, 349, 350

(56) References Cited

U.S. PATENT DOCUMENTS

| | | | | |
|---|---|---|---|---|
| 3,222,217 A | * | 12/1965 | Grabmaier | 427/234 |
| 3,328,199 A | * | 6/1967 | Sirti | 117/97 |
| 3,679,470 A | * | 7/1972 | Rogers et al. | 427/588 |
| 4,147,814 A | | 4/1979 | Yatsurugi et al. | |
| 4,150,168 A | | 4/1979 | Yatsurugi et al. | |
| 5,310,531 A | * | 5/1994 | Ikeda et al. | 423/324 |

FOREIGN PATENT DOCUMENTS

| | | |
|---|---|---|
| JP | 45-19562 | 7/1970 |
| JP | 56-45850 | 10/1981 |
| JP | 56-45851 | 10/1981 |
| JP | 56-45852 | 10/1981 |

* cited by examiner

*Primary Examiner*—Timothy Meeks
(74) *Attorney, Agent, or Firm*—Armstrong, Westerman & Hattori, LLP.

(57) ABSTRACT

In producing rod-form high-purity polycrystalline silicon by depositing silicon on a silicon core by the thermal decomposition of a silane gas, the occurrence of defects near the interface of the silicon core and polycrystalline silicon newly deposited thereon is prevented. A silicon core before depositing silicon thereon is subjected to a hydrogen treatment. In this case, the treatment temperature and the treatment time are controlled according to the dew point of the hydrogen gas. After the hydrogen treatment, the hydrogen gas in a reactor may be replaced with a high-purity hydrogen gas, followed by producing a polycrystalline silicon by a silane gas.

4 Claims, 4 Drawing Sheets

FIG. 4

|  | Number of polycrystalline silicon rods giving each single crystallization ratio | | |
|---|---|---|---|
|  | 100% | 50% or more | less than 50% |
| Example 1 | 8 | 2 | 0 |
| Example 2 | 7 | 2 | 1 |
| Example 3 | 9 | 0 | 1 |
| Conventional product | 6 | 1 | 3 |

METHOD OF PRODUCING HIGH-PURITY POLYCRYSTALLINE SILICON

TECHNICAL FIELD

The present invention relates to a method of producing high-purity polycrystalline silicon using a silane ($SiH_4$) gas as a raw material, which is used in large quantities, for example, as substrate materials of semiconductor devices.

BACKGROUND ART

Since high-purity silicon began to be used for semiconductor devices, longer than 40 years have already passed. During this period, by being supported by the remarkable progress of semiconductor devices, the utilization field of high-purity silicon has expanded, and the demand thereof has greatly increased. Also, with the increase of the performance of semiconductor devices, the high-increase of the quality of a silicon wafer which is a substrate thereof has been required, and further, the more increase of the quality of polycrystalline silicon as a raw material thereof has been required.

High-purity polycrystalline silicon for semiconductor is melted, and after being remade in a state of a single crystal, is used for a semiconductor device. As a method for the production of single crystal silicon, there are a floating zone melting method (hereinafter, is referred to as FZ method) and a Czochralski method (hereinafter, is referred to as CZ method), and forms of polycrystalline silicon used for these methods are different from each other. That is, in the FZ method, polycrystalline silicon produced in a rod form having a diameter of several tens mm or larger and a length of from 1 to 2 m is used, and in the CZ method, nugget silicon formed by breaking the above-described rod-form polycrystalline silicon is used.

Because in the FZ method, a vessel such as a quartz crucible as used in the CZ method is not used, and molten silicon is single-crystallized in a state of being supported by the own surface tension, the quality of the polycrystal largely influences the single crystallization. Also, conventionally, the FZ method is carried out at least twice as is shown in JP-B-45-19562 (the term "JP-B" as used herein means an "examined published Japanese patent application"). That is, by at least one preliminary FZ method, defects during the growth of polycrystal are vanished, and in at least one subsequent second FZ method using a seed crystal, a single crystal is obtained. However, because the FZ method is carried out at least twice, because of the FZ apparatus cost, the FZ operation cost (expenses and labor), and the material loss for the polycrystal regulation occurring in carrying out the FZ method, etc., the cost becomes very high. Accordingly, recently, a method of producing a polycrystalline rod capable of achieving single crystallization by using only one time of the FZ method has been strongly desired.

In the defects existing in polycrystalline silicon, the main ones giving bad influences at the single crystallization by the FZ method are an abnormal growth occurred near the interface between a silicon core and polycrystalline silicon newly grown on the surface thereof and the porosity created accompanied by the abnormal growth. About the defects, as shown, for example, in JP-B-56-45852, a method of reducing the defects near the interface between the surface of the silicon core and the newly grown polycrystalline silicon by lowering, particularly, the reaction temperature under the thermal decomposition conditions at the beginning of the growth of polycrystal than the temperature at an ordinary thermal decomposition by several tens ° C., and other efforts for solving the problems have been made for many years, and improvements have been made a little by little.

However, as the result of investigating the mechanism of the deposition of polycrystalline silicon by the thermal decomposition of a silicon hydrides over several tens years, the inventors have recognized that the occurring ratio of the defects near the above-described interface changes according to the cleanness and the ununiformity of the surface of the silicon core, and in the case of production on an industrial scale, a silicon core having a good quality for surface chemistry, it is very difficult to completely vanish the defects near the above-described interface thereby.

Also, the semiconductor product produced from a single crystal by the FZ method is generally required to have a low oxygen concentration as compared with a semiconductor product produced from a single crystal by the CZ method.

SUMMARY OF THE INVENTION

The present invention has been made aiming at the above-described problems in the prior art, and an object of the invention is to provide a method of producing high-purity silicon capable of preventing the occurrence of the defects such as abnormal growth in the vicinity of the interface between the silicon core and polycrystalline silicon to be newly deposited on the surface thereof in the case of producing polycrystalline silicon by the thermal decomposition of a silane gas.

In order to achieve the above-described object, a first aspect of a method of producing rod-form high-purity polycrystalline silicon according to this invention comprises depositing silicon on a silicon core by a thermal decomposition of a silane gas, wherein in applying to a silicon core a hydrogen treatment before depositing silicon, the heating temperature and the heating time of the silicon core are controlled according to a dew point of a hydrogen gas filled in a thermal decomposition reactor.

According to the first aspect of this invention, it is presumed that by controlling the heating temperature and the heating time at the hydrogen treatment for the silicon core according to the dew point of the hydrogen gas, the active sites interspersed on the surface of the silicon core are reacted with a vapor of water in the hydrogen gas to become a passive state, whereby the surface-chemically uniform surface of the silicon core is obtained. And thereby, the occurrence of the defects such as abnormal growth and porosity in the vicinity of the interface between the silicon core and polycrystalline silicon to be newly deposited onto the surface thereof can be restrained.

According to a second aspect of this invention, there is provided a method of producing high-purity polycrystalline silicon of the first aspect, wherein when the dew point of the hydrogen gas filled in the thermal decomposition reactor is high, a heat treatment of a high temperature and a short time is applied to the silicon core in the hydrogen gas.

According to the second aspect of this invention, in order make sure the passivation of the whole silicon core, when the dew point of the hydrogen gas is high, that is, when the content of vapor of water contained in the hydrogen gas is relatively high, by applying a hydrogen treatment of a high temperature and a short time to the silicon core, the passivation of the active sites interspersed on the surface of the silicon core can be accelerated, and also the increase of the oxygen concentration can be restrained.

Also, according to a third aspect of this invention, there is provided a method of producing high-purity polycrystalline silicon of the first aspect, wherein when the dew point of the hydrogen gas filled in the thermal decomposition reactor is low, a heat treatment of a low temperature and a long time is applied to the silicon core in the hydrogen gas.

According to the third aspect of this invention, when the dew point of the hydrogen gas is low, that is, when the content of vapor of water contained in the hydrogen gas is relatively low, by applying a hydrogen treatment of a low temperature and a long time to the silicon core, the passivation of the active sites interspersed on the surface of the silicon core can be accelerated.

According to a forth aspect of this invention, there is provided a method of producing high-purity polycrystalline silicon of the first aspect, wherein after finishing the hydrogen treatment of the silicon core, the hydrogen gas in the thermal decomposition reactor is replaced with a high-purity hydrogen gas, and thereafter, the production of polycrystalline silicon by the thermal decomposition of the silane gas is carried out.

According to the forth aspect of this invention, since after passivating the whole surface of the silicon core, the hydrogen gas used in the hydrogen treatment is replaced with a high-purity hydrogen gas, the thermal decomposition of the silane gas to be successively carried out can be proceeded without hindrance. Also, because by this treatment, the oxygen concentration in polycrystalline silicon formed is reduced, the single crystal by the FZ method using the polycrystalline silicon is suitable for the production of a semiconductor product.

BRIEF DESCRIPTION OF THE DRAWINGS

FIG. 4 is a table showing the results of each of 10 rod-form polycrystalline silicons obtained by each of the Examples 1 to 3 and the method of conventional technology.

BEST MODE FOR CARRYING OUT THE INVENTION

Figure 1:
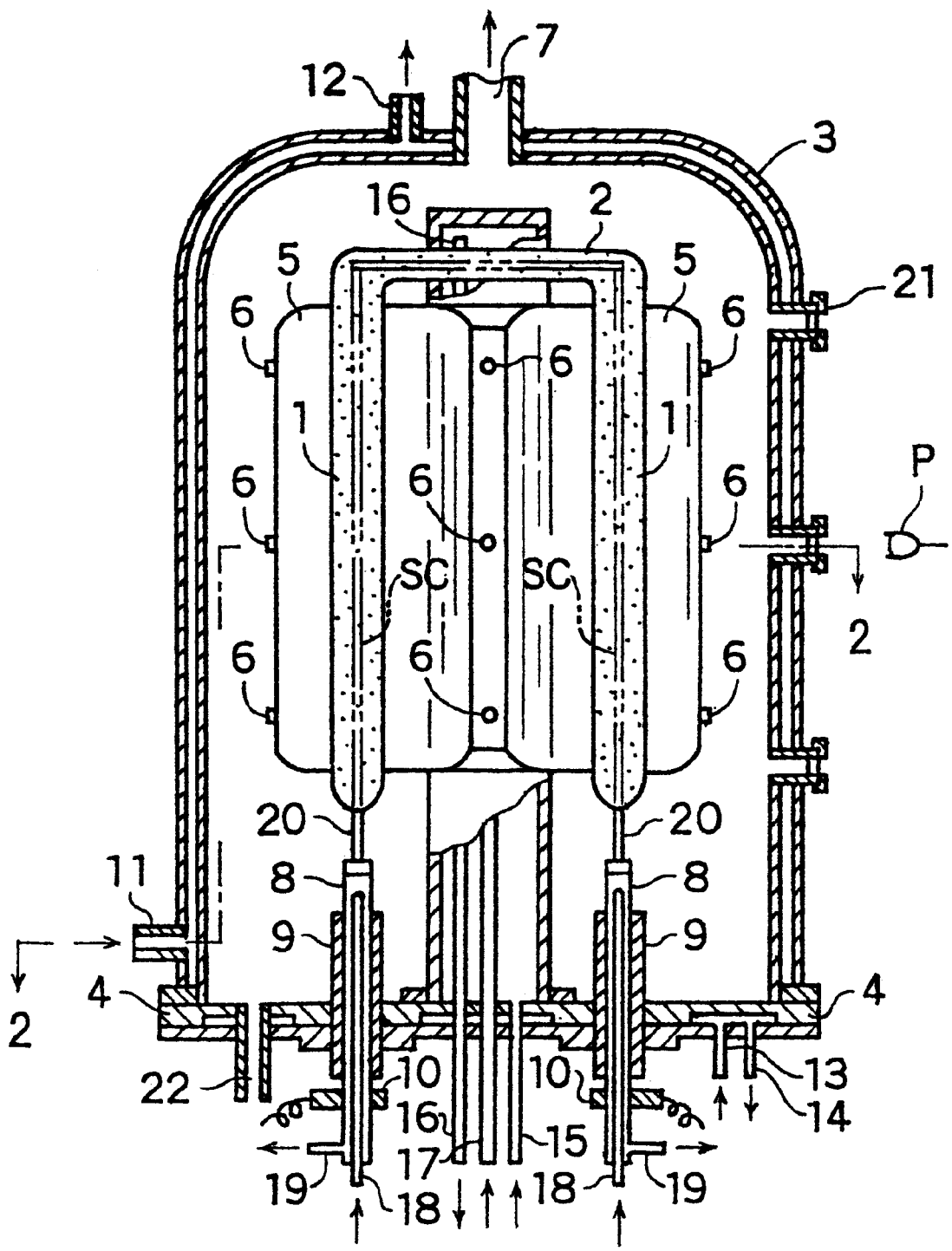
FIG. 1 is a longitudinal cross-section of a thermal decomposition reactor, which basic structural concept is the same as the industrial thermal decomposition reactor, used in the Examples of this invention.

The method of producing high-purity polycrystalline silicon of this invention is explained about the embodiments and the Examples by referring to the drawings described in JP-B-56-45850 (U.S. Pat. No. 4,150,168) and JP-B-56-45851 (U.S. Pat. No. 4,147,814), which are the original models of the reactor used in the experiment of this invention.

Figure 2:
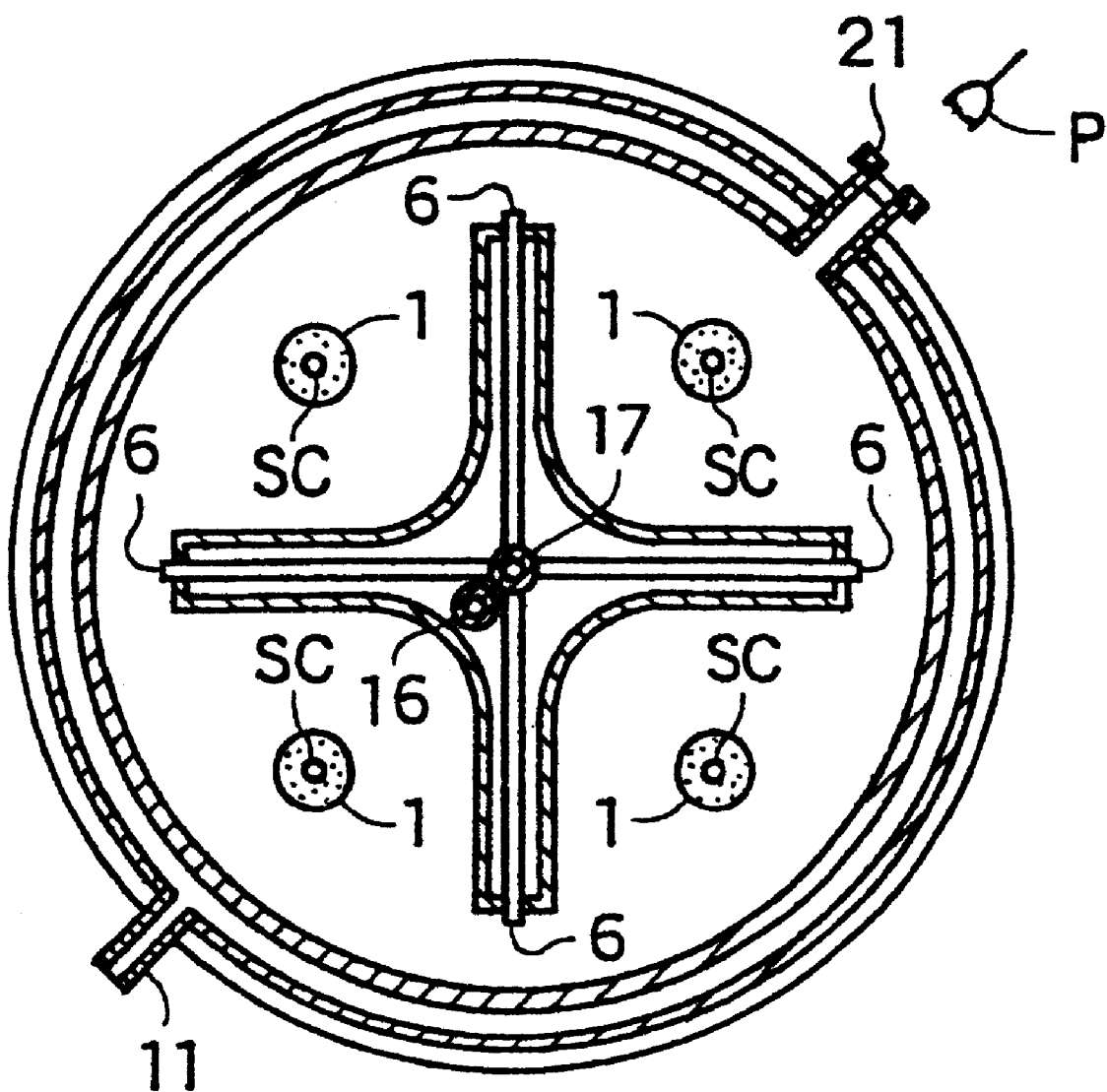
FIG. 2 is a cross-sectional view along the 2—2 line of FIG. 1.

FIG. 1 is a longitudinal cross-section of a thermal decomposition reactor, which basic structural concept is the same as the industrial thermal decomposition reactor, used in the example, and FIG. 2 is a cross-sectional view cut along the 2—2 line of FIG. 1. The thermal decomposition reactor can produce high-purity rod-form polycrystalline silicon by the thermal decomposition of a silane gas, and the reactor is constructed by a bell jar 3, a base plate 4, and a heat shielding material 5. The base plate 4 is equipped with an inlet 13 and an outlet 14 of water for cooling the inside of the reactor, at least one pair of copper electrodes 8 each covered with an insulator 9 and having a water-cooling structure by an inlet 18 and an outlet 19 of water, an inlet 22 of a gas stream for gas-replacing the inside atmosphere of the reactor, fixing portions of the heat shielding materials 5, etc. The bell jar 3 is equipped with an inlet 11 and an outlet 12 of water for water cooling, an observation window 21, and a total exhaust port 7 holding an outlet of a reaction gas and a gas (Ar or H2) for replacing the inside atmosphere of the reactor in addition to a hole for evacuating the inside of the reactor. Also, the heat shielding materials 5 each is equipped with an inlet 15 and an outlet 16 of water for water cooling, a supplying pipe 17 for supplying a silane gas from outside, and inlets 6 for supplying the same gas in the reactor. Each of the parts is made of a stainless steel at the side of the inside of the reactor, has a structure of being wholly water-cooled, and has a strict airtight structure for maintaining the inside of the reactor in vacuum or at a positive pressure.

The silicon core SC for depositing and growing polycrystalline silicon is prepared by connecting the ends of two crystal rods to each other, which are produced using a specific FZ method (slim rod method) and have a predetermined diameter (for example, about 7 mm) and a predetermined length (for example, about 2 m), and after being subjected to a chemical etching treatment, two sets of them are disposed in a reverse U-form in the cleaned and water-cooled reactor as shown in FIG. 1. In addition, the number of the silicon cores SC is not limited to two sets as the embodiment described above but may be at least one set. Each of the silicon cores SC is fitted to a tantalum-made connecting pole 20 connected to the tip of the copper electrode 8 and is heated by an electric power supplied from a feeder 10. The temperature of the silicon cores SC or the growing rod-form polycrystalline silicon 1 is measured by an optical pyrometer P disposed outside the observation window 21 and based on the measured value, the supplying electric power is controlled. By depositing silicon on each of the silicon cores SC, the diameter is increased, and the rod-form polycrystalline silicon 1 is produced. In addition, on the connected portion of the two rod-form polycrystalline silicons 1, 1 facing each other is formed a short rod-form polycrystalline silicon 2.

The method of producing high-purity polycrystalline silicon of this invention is described with reference to the following Examples.

EXAMPLE 1

Figure 3:
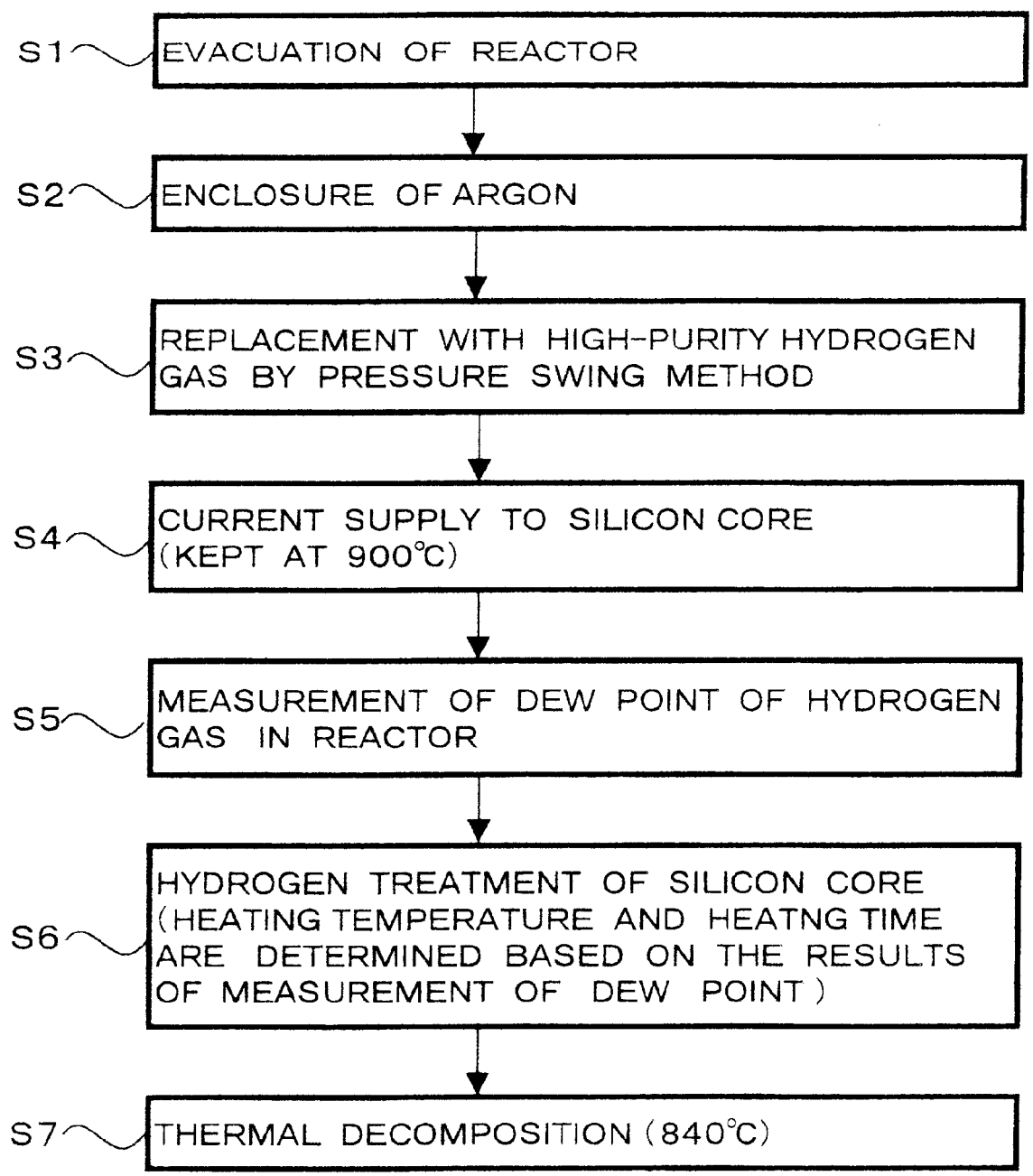
FIG. 3 is a flow chart showing the steps of the method for the production in Example 1.

FIG. 3 is a flow chart showing the steps of the production method of this invention. In FIG. 3, each step number is designated with a mark "S".

A predetermined number of silicon core(s) SC were disposed in the reactor, after closing the bell jar 3 and confirming the airtightness, the inside of the reactor was evacuated (S1), and then an argon gas was introduced in the reactor (S2). Then, the argon gas was replaced with a high-purity hydrogen gas (S3). For the sake of safety (that is, the air does not enter the reactor), it is desirable to carry out the hydrogen gas displacement by employing a pressure swing method under a positive pressure. In the case of this Example, the replacement was carried out by repeating the operation of changing the pressure in the reactor between the upper and lower two predetermined pressures in the range of from 1 absolute pressure to 2 absolute pressure. Then, an electric current was passed through the silicon cores SC, and the temperature thereof was kept at 900° C. (S4). A small amount of a hydrogen gas was supplied into the reactor, and the dew point of the hydrogen gas discharged thereby was measured (S5). The dew point gradually raised with a lapse of time and became stable at −28° C. Thereafter, based on the measurement result, the temperature of the silicon cores SC was raised to 1,200° C. and was maintained for 20 minutes (S6). The dew point of the hydrogen gas raised to −25° C. during the heat treatment of the silicon cores SC.

Then, the temperature of the silicon cores SC was lowered to 840° C., which was the production temperature of polycrystalline silicon, and a silane gas in an amount growth rate of 5 ($\mu$m/minute was supplied into the reactor (S7). With the increase of the diameter of polycrystalline silicon deposited on the silicon cores SC, the temperature of the silicon cores and the supplying amount of the silane gas were lowered little by little to grow the polycrystalline silicon until the diameter became 100 mm.

A part of the rod-form polycrystalline silicon obtained by the above-described production method was cut in the circumferential direction, the cut surface was lapped with an abrasive, and after etching with a mixed solution of nitric acid and hydrofluoric acid, the observation near the interface of the silicon core and the polycrystalline silicon deposited on the surface thereon and the measurement of the oxygen concentration distribution of the newly grown layer were carried out. As the evaluation results of the defects such as the abnormal growth and the porosity near the interface, in the 8-grades evaluation of from rank 0 (no defect) to rank 7, the products by the conventional technology showed the ranks of from 3 to 7, while the products of the Example of this invention showed the ranks of from 0 to 2. Also, in the oxygen concentration, at the positions of from 1 to 2 mm near the silicon core, the value of from 10 to 20 ppma (Provided that the definition of ppma unit is ppma={number of oxygen atom/(number of silicon atom+number of oxygen atom)}×$10^6$) was obtained.

EXAMPLE 2

In the same procedures as in Example 1, the temperature of the silicon cores was maintained at 900° C., and the dew point of −58° C. of the stabilized exhaust hydrogen gas was obtained. Based on the measurement result, the temperature of the silicon cores was set to 950° C. and maintained for 90 minutes. During the hydrogen treatment, the dew point of the exhaust hydrogen gas raised to −57° C. Thereafter, the polycrystalline silicon was grown by the method as in Example 1 until the diameter became 100 mm.

In the evaluation results of the defects such as the abnormal growth near the interface of the silicon core and the polycrystalline silicon formed and the porosity about the polycrystalline silicon obtained by the production method of this invention, the rank was from 0 to 3, and the oxygen concentration was from 4 to 9 ppma.

EXAMPLE 3

In the same procedures as in Example 1, the temperature of the silicon cores was maintained at 900° C., and the dew point of −30° C. of the stabilized exhaust hydrogen gas was obtained. Based on the measurement result, the temperature of the silicon cores was set to 1,200° C. and maintained for 25 minutes. During the hydrogen treatment, the dew point of the exhaust hydrogen gas raised to −27° C. Thereafter, the temperature of the silicon cores was lowered to 840° C., and the inside atmosphere of the reactor was replaced with a high-purity hydrogen gas until the dew point in the reactor became −70° C. or lower. Also, the thermal decomposition of a silane gas was carried out under the same conditions as in Example 1 until the diameter became 100 mm.

About the polycrystalline silicon obtained by the production method of Example 3, in the evaluation results of the abnormal growth near the interface of the silicon cores and the polycrystalline silicon formed, the rank was from 0 to 2, and the oxygen concentration was from 6 to 13 ppma. The dew point of the hydrogen gas at the hydrogen treatment and the heating temperature and the heating time of the silicon cores were not largely different between Example 3 and Example 1, but in Example 3, after the hydrogen treatment of the silicon cores, the hydrogen gas in the reactor was replaced with a new high-purity hydrogen gas to lower the dew point. The effect thereof appears as the difference of the oxygen concentration (10 to 20 ppma) in Example 1 and the oxygen concentration (6 to 13 ppma) in Example 3.

Each of 10 rod-form polycrystalline silicons obtained in each of the foregoing Examples 1 to 3 and 10 rod-form polycrystalline silicons obtained by the method of conventional technology was single-crystallized by the FZ method. The results are shown in FIG. 4. As a result of the evaluation based on the long experiments of the present inventors, the conclusion that there were no differences on the quality of the rod-form polycrystalline silicon obtained in Examples 1 to 3 and that the single crystallization ratio was low in only the product by the method of conventional technology was obtained.

As described above, according to this invention, by applying a hydrogen treatment to a silicon core prior to the silicon deposition onto the silicon core by the thermal decomposition of a silane gas, and in this case, by controlling the temperature and the time of the hydrogen treatment according to the dew point of the hydrogen gas, the whole surface of the silicon core becomes a passive state. Accordingly, the occurrences of the defects such as abnormal growth near the interface between the silicon core and the silicon layer deposited thereon and porosity are restrained, and the single crystallization ratio can be improved.

What is claimed is:

1. A method of producing rod-form high-purity polycrystalline silicon by depositing silicon on a silicon core by a thermal decomposition of a silane gas, wherein in applying to a silicon core a hydrogen treatment before depositing silicon, the heating temperature and the heating time of the silicon core are controlled according to a dew point of a hydrogen gas filled in a thermal decomposition reactor.

2. A method of producing rod-form high-purity polycrystalline silicon as claimed in claim 1, wherein when the dew point of the hydrogen gas filled in the thermal decomposition reactor is high, a heat treatment of a high temperature and a short time is applied to the silicon core in the hydrogen gas.

3. A method of producing rod-form high-purity polycrystalline silicon as claimed in claim 1, wherein when the dew point of the hydrogen gas filled in the thermal decomposition reactor is low, a heat treatment of a low temperature and a long time is applied to the silicon core in the hydrogen gas.

4. A method of producing rod-form high-purity polycrystalline silicon as claimed in claim 1, wherein after finishing the hydrogen treatment of the silicon core, the hydrogen gas in the thermal decomposition reactor is replaced with a high-purity hydrogen gas, and the production of polycrystalline silicon by the thermal decomposition of the silane gas is then carried out.

* * * * *